United States Patent [19]
Fujitsu

[11] Patent Number: 5,654,584
[45] Date of Patent: Aug. 5, 1997

[54] SEMICONDUCTOR DEVICE HAVING TAPE AUTOMATED BONDING LEADS

[75] Inventor: Takao Fujitsu, Yokohama, Japan

[73] Assignee: Kabushiki Kaisha Toshiba, Kawasaki, Japan

[21] Appl. No.: 344,605

[22] Filed: Nov. 18, 1994

Related U.S. Application Data

[63] Continuation of Ser. No. 77,317, Jun. 15, 1993, abandoned, which is a continuation of Ser. No. 707,763, May 30, 1991, abandoned.

[30] Foreign Application Priority Data

Jun. 1, 1990 [JP] Japan ............... 2-141684

[51] Int. Cl.$^6$ ............... H01L 23/415; H01L 23/48
[52] U.S. Cl. ............... 257/666; 257/763; 257/764; 257/735; 257/736
[58] Field of Search ............... 357/68, 65, 71, 357/70; 257/666, 667, 763, 764, 735, 704, 779, 778, 736

[56] References Cited

U.S. PATENT DOCUMENTS

| | | | |
|---|---|---|---|
| 4,176,443 | 12/1979 | Iannuzzi | 257/763 |
| 4,280,132 | 7/1981 | Hayakawa et al. | 257/667 |
| 4,496,965 | 1/1985 | Orcutt et al. | 357/70 |
| 4,626,960 | 12/1986 | Hamano et al. | 257/704 |
| 4,839,713 | 6/1989 | Teraoka et al. | 357/70 |
| 4,885,630 | 12/1989 | Temple | 257/763 |
| 4,922,322 | 5/1990 | Mathew | 257/779 |
| 4,948,645 | 8/1990 | Holzinger et al. | 357/70 |
| 4,977,441 | 12/1990 | Ohtani et al. | 357/70 |
| 5,016,082 | 5/1991 | Roth | 257/735 |

FOREIGN PATENT DOCUMENTS

| | | |
|---|---|---|
| 55-24479 | 2/1980 | Japan ............... 257/735 |
| 57-143848 | 9/1982 | Japan . |
| 57-50056 | 10/1982 | Japan . |
| 60-092636 | 5/1985 | Japan . |
| 61-208245 | 9/1986 | Japan . |
| 62-108534 | 5/1987 | Japan . |
| 62-208642 | 9/1987 | Japan . |
| 62-296431 | 12/1987 | Japan . |
| 63-073644 | 4/1988 | Japan . |
| 1019752 | 1/1989 | Japan . |
| 1073734 | 3/1989 | Japan . |
| 01207938 | 8/1989 | Japan . |
| 1276750 | 11/1989 | Japan . |
| 2033929 | 2/1990 | Japan . |
| 2087538 | 3/1990 | Japan . |
| 2-66953 | 3/1990 | Japan . |
| 2119252 | 5/1990 | Japan . |
| 2121359 | 5/1990 | Japan . |
| 2208957 | 8/1990 | Japan . |

Primary Examiner—Carl W. Whitehead, Jr.
Attorney, Agent, or Firm—Finnegan, Henderson, Farabow, Garrett & Dunner, L.L.P.

[57] ABSTRACT

A plurality of electrode pads are formed on a main surface of a semiconductor chip. The electrode pads on the semiconductor chip are electrically connected to the top end of an inner lead through a metal plating layer.

36 Claims, 5 Drawing Sheets

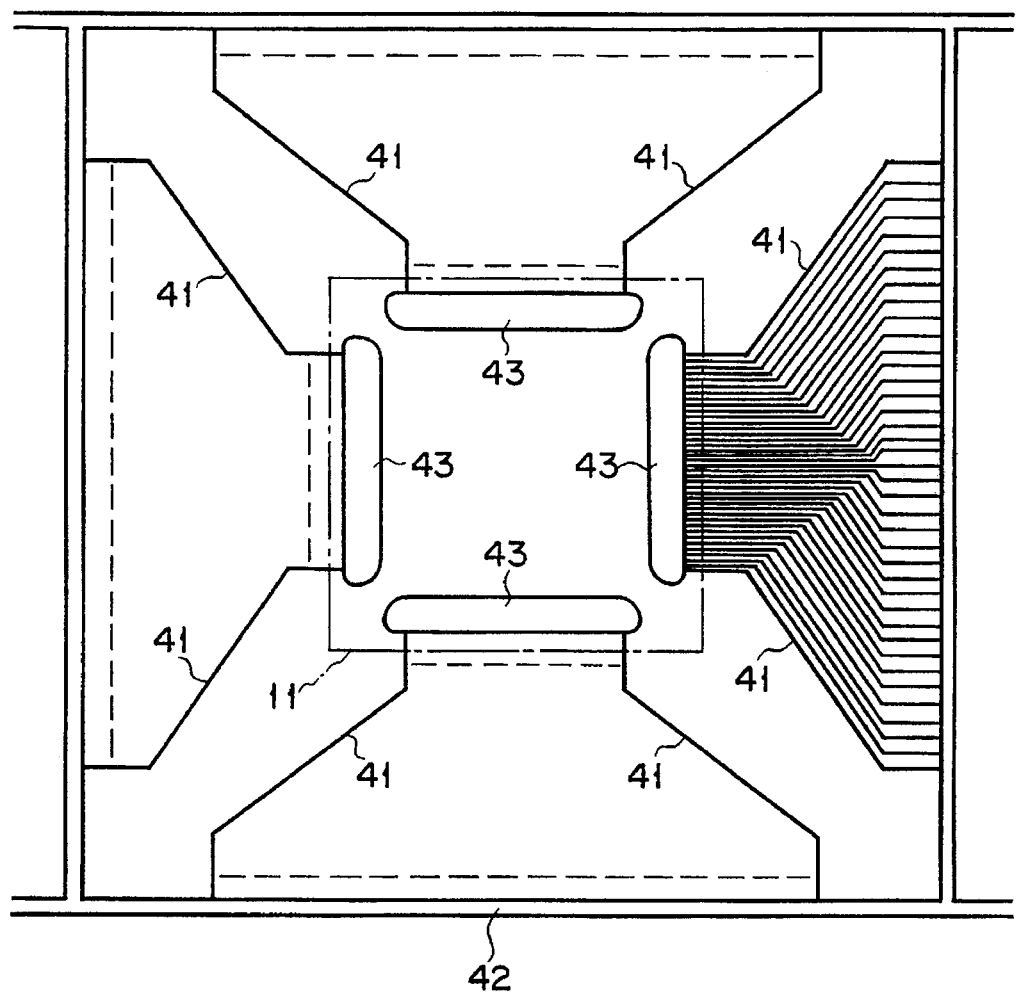
F I G. 6

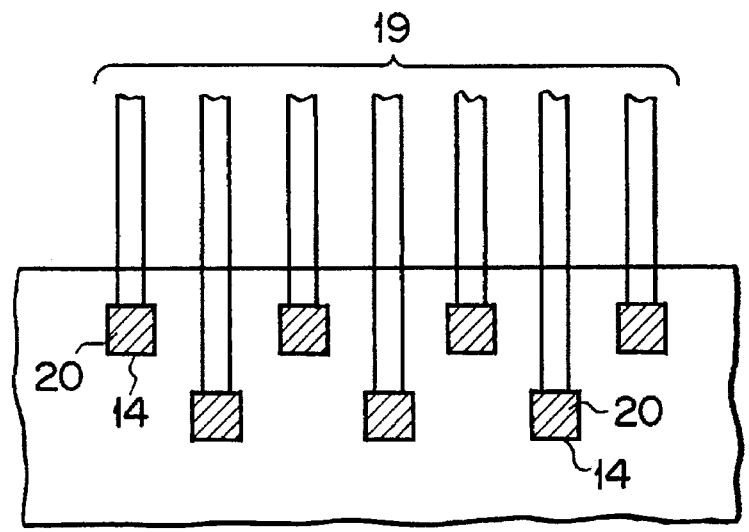
F I G. 7
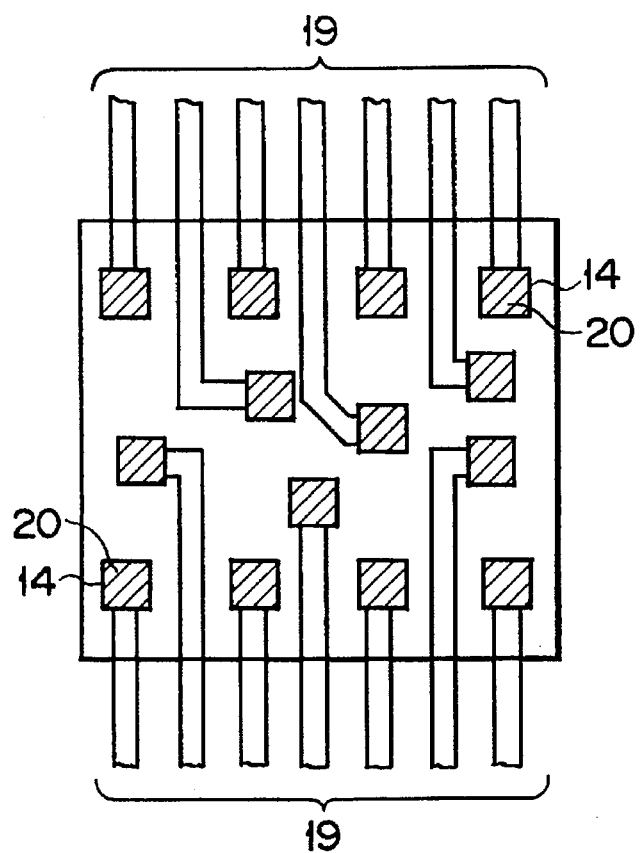
F I G. 8

SEMICONDUCTOR DEVICE HAVING TAPE AUTOMATED BONDING LEADS

This application is a continuation of application Ser. No. 08/077,317, filed Jun. 15, 1993 now abandoned, which is a continuation of application Ser. No. 07/707,763 filed May 30, 1991, now abandoned.

BACKGROUND OF THE INVENTION

1. Field of the Invention

The present invention relates to a semiconductor device, in which an electrical connection between electrodes on a semiconductor chip and inner leads of a lead frame is provided and an electrical connection between outer leads of the lead frame and wiring patterns on a print circuit board is provided, and its manufacturing method, and more particularly to a semiconductor device wherein the distance between electrodes on the semiconductor chip to provide the electrical connection and the distance between the inner leads of the lead frame and the distance between the outer leads thereof are small, and its manufacturing method.

2. Description of the Related Art

When the semiconductor device is manufactured, there are numerous portions where an electrical connection is to be provided such as a portion between an electrical pad on a semiconductor chip and an inner lead of a lead frame, and a portion between an outer lead of the lead frame and a wiring pattern on a print circuit board.

Conventionally, for example, the electrical connection between the electrode pad on the semiconductor chip and the inner lead is made by a metal bonding such as a wire bonding using AU wire or Al wire, a TAB (Tape Automated Bonding) method, an ohmic contact such as a metal contact between a bump electrode on a flip chip and a lead, and the like.

Regarding the connection by the wiring bonding, the shortest distance between adjacent wires is restricted by the outer shape of a bonding capillary to be used. Due to this, it is difficult to reduce the distance between the pads on the semiconductor chip to be about 100 µm.

Moreover, in order to connect an Au ball or an Al wire to an aluminum pad on the semiconductor chip, it is necessary to apply a physical load such as by heating, pressing, or ultrasonic vibration. Therefore, damage is often applied to the semiconductor chip itself under the electrode pad.

In a case where TAB system or the flip chip is used, it is necessary to metal-connect an Au bump or an plating bump to the inner lead. Due to this, the temperature often increases higher than that of the wire bonding connection, so that physical damage due to pressure occurs. In this case, the distance between the pads can be reduced to about 80 µm, however, there is a limitation in the reduction of the bump size because of the use of the metal connection. Moreover, a large number of portions are connected at the same time. Due to this, as the number of portions to be connected is increased, it is more difficult to obtain a stable connection in view of the height of the bump, and the condition of the connection. Due to this, it is required that the process conditions be stabilized.

The above-mentioned problem occurs in not only the electrical connection between the pad on the semiconductor chip and in the bump and the inner lead but also in the electrical connection between the outer lead and the wiring pattern on the printed circuit board.

SUMMARY OF THE INVENTION

An object of the present invention is to provide a semiconductor device, in which the distances between portions to be electrically connected can be reduced more than in the conventional case and high reliance can be obtained without applying physical damage due to heating and, pressurizing when the electrical connection is made, and its manufacturing method.

According to the present invention, there is provided a semiconductor device comprising a lead frame formed of a conductive material, a semiconductor chip having a plurality of electrodes on its surface, and a connect section where the lead frame is electrically connected to the plurality of electrodes on the semiconductor chip by a metal plating.

Moreover, according to the present invention, there is provided a semiconductor device comprising an insulating film, a wiring pattern formed on the insulating film, a semiconductor chip having a plurality of electrodes on its surface, and a connect section where the end surface of the wiring pattern is electrically connected to the plurality of electrodes on the semiconductor chip by a metal plating.

Furthermore, according to the present invention, there is provided a semiconductor device comprising a lead frame to which a semiconductor chip is connected, a wiring board having a wiring pattern on its surface, and a connect section where the lead frame is electrically connected to the wiring pattern on the wiring substrate by a metal plating.

Furthermore, according to the present invention, there is provided a semiconductor device comprising a lead frame formed of a conductive material, a semiconductor chip having an electrode on its surface, a first connect section where the lead frame is electrically connected to an electrode on the semiconductor chip by a conductive adhesive, and a second connect section where the lead frame is electrically connected to the electrode on the semiconductor chip by a metal plating to cover the surroundings of the first connect section.

Also, according to the present invention, there is provided a manufacturing method of a semiconductor device comprising the steps of moving a lead frame formed of a conductive material and an electrode formed on a surface of a semiconductor chip to be close to each other and adhering the semiconductor chip to the lead frame, and immersing the lead frame and the semiconductor chip in an electrolytic plating solution and forming a metal plating layer where the lead frame is electrically connected to the electrode on the semiconductor chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5 and 6 are plane views of a TAB tape, which is used in the device of the first embodiment of the present invention;

FIGS. 7 and 8 are plane views of modifications of the device of the first embodiment of the present invention;

DETAILED DESCRIPTION OF THE PREFERRED EMBODIMENTS

The embodiments of the present invention will be explained with reference to the drawings.

Figure 1:
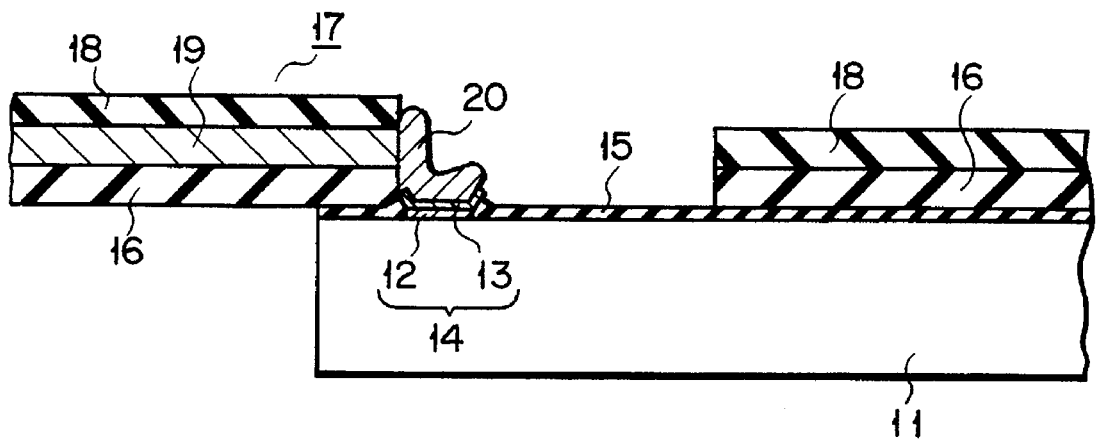
FIG. 1 is a cross sectional view showing the structure of a part of a device of a first embodiment of the present invention.
Figure 2:
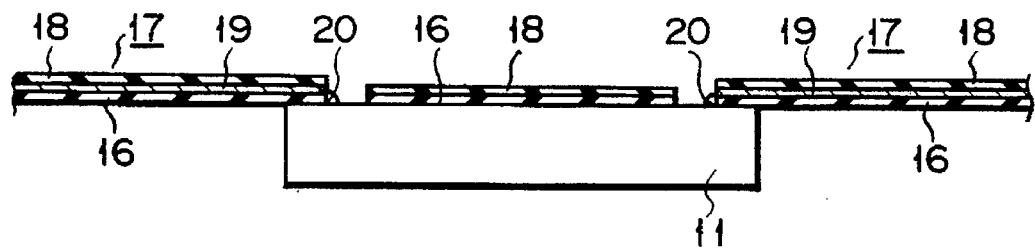
FIG. 2 is a cross sectional view showing a general structure of the device of the first embodiment of the present invention.

FIG. 1 shows the structure of a part of a semiconductor device of a first embodiment of the present invention wherein the present invention is used in the connection between a plurality of electrode pads on a semiconductor chip and a plurality of inner leads, and FIG. 2 is the general structure thereof.

In the drawings, reference numeral 11 is a semiconductor chip including an active element such as a transistor and a passive element such as a resistor and a capacitor. Around the main surface of the semiconductor chip 11, there are formed a plurality of electrode pads 14, which are formed of a first metal layer 12 whose lower layer is formed of aluminum (Al) and a second metal layer 13 whose upper layer includes at least one nickel layer. These electrode pads 14 are arranged in line with a predetermined distance. The portions of the semiconductor chip 11 other than the electrode pad formation position are covered with an insulating surface protection film 15 such as a silicon oxidation film. The semiconductor chip 11 is adhered to a predetermined portion of a TAB tape 17 by an epoxy adhesive 16.

As shown in FIG. 1, the TAB tape 17 is made of epoxy or polyimide resin. Metal foil such as copper (Cu) foil having a thickness of about 35 μm is laminated on an organic film material 18 having a thickness of about 75 μm. Thereafter, there is formed a wiring pattern comprising a plurality of inner leads 19 to be connected to the plurality of electrode pads 14 by a selection etching technique and outer leads electrically connected to the inner leads (not shown). The wiring pattern forming surface is adhered to the semiconductor chip 11 by the adhesive 16.

When the semiconductor chip 11 is adhered to the TAB tape 17, the positioning is performed such that each electrode pad 14 is positioned close to the portion where each end surface of the end portions of the plurality of inner leads 19 is exposed. Then, each electrode pad 14 on the semiconductor chip 11 and each end portion of the inner lead 19 are electrically connected through a metal plating layer 20 formed of nickel (Ni).

Figure 3:
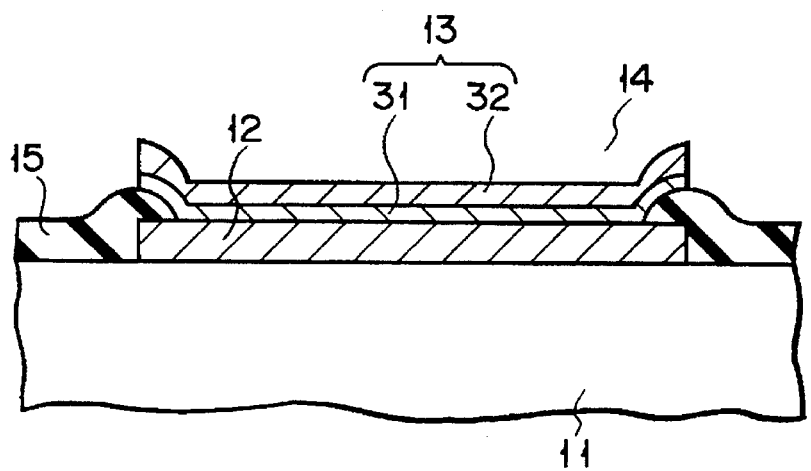
FIG. 3 is a cross sectional view showing a specific structure of an electrode pad of the device of the first embodiment of the present invention.

FIG. 3 shows the specific structure of each electrode pad 14. In this embodiment, the second metal layer 13, formed on the first metal layer 12 made of aluminum (Al), comprises at least two metal layers. More specifically, the lower layer contacting the first metal layer made of aluminum is formed of a titanium (Ti) layer 31 having a thickness of 1000 Å, and the upper layer is formed of the nickel (Ni) layer 32 having a thickness of 3000 Å. The nickel layer 32, which is the upper layer of the second metal layer 13 is formed to allow the metal plating layer 20 made of nickel to be formed on the electrode pad 14. Also, the titanium layer 31, which is the lower layer of the second metal layer 13, functions as a barrier metal.

Figure 4:
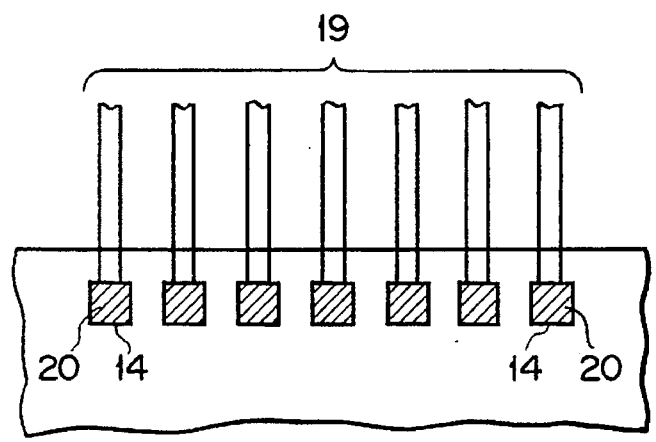
FIG. 4 is a plane view showing the connection between a plurality of electrode pads of the device of the first embodiment and a plurality of inner leads.

FIG. 4 shows the connection between the plurality of electrode pads 14 and the plurality of inner leads 19 formed on the TAB tape 17. In the drawing, a region in which slant lines are added shows the metal plating layer 20.

In the above embodiment, each electrode pad 14 on the semiconductor chip 11 and each inner lead 19 are connected by the metal plating layer 20. Due to this, bonding capillary and TAB tool, which are used to the wire bonding and TAB connection are not required. Therefore, the distance between electrode pads 14 can be reduced to 100 μm or less, for example, to about 50 μm.

Moreover, if each electrode pad 14 and each inner lead 19 are electrically connected, no physical pressure is applied to the semiconductor chip 11, so that reliance due to pressure damage is not lowered. Then, since a large number of portions can be connected at the same time under the same condition, reliance of connection can be improved. Moreover, since there is no need of heating when the connection is performed, it is possible to prevent reliance from being lowered by thermal stress, which is caused by a mismatch between the coefficient of thermal expansion of each semiconductor layer in the semiconductor chip.

A method of forming the above metal plating layer where the electrode pads and the inner leads are electrically connected will be explained.

Figure 5:
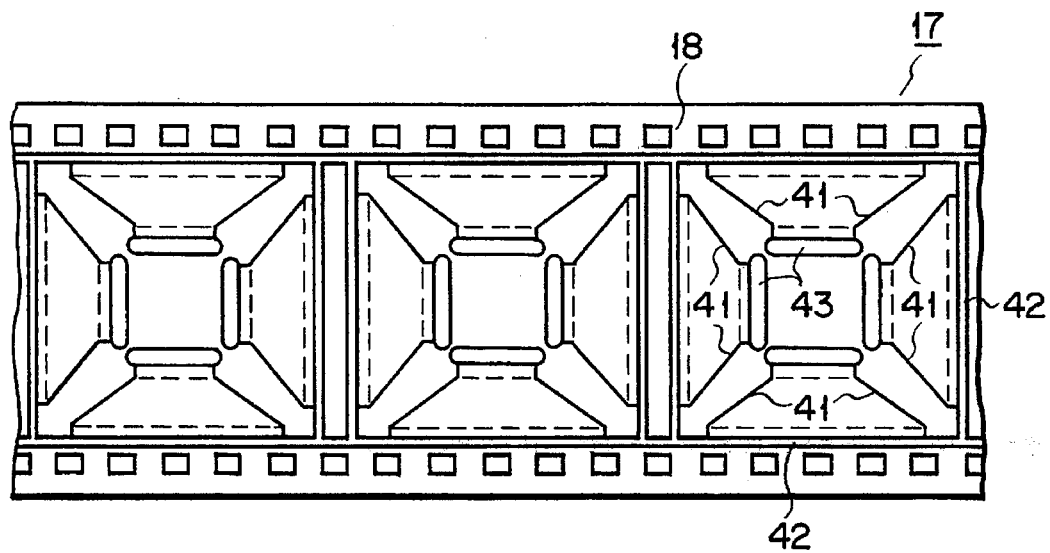

In TAB tape 17, as shown in FIG. 5, metal foil such as copper foil is laminated on the organic film material 18 in advance. Thereafter, in every semiconductor device, there are formed a plurality of lead electrodes 41 comprising the inner leads and the outer leads connected to the inner leads by the selection etching technique. At the same time when the selection etching is performed, common electrodes 42, which are electrically connected to the lead electrodes 41, are formed around each semiconductor device so that all common electrodes 42 are connected. Additionally, in FIG. 5, reference numeral 43 is an opening formed in the organic film material 18.

FIG. 6 shows an enlarged one of the semiconductor device in the TAB tape of FIG. 5 In the drawing, the semiconductor chip is adhered to TAB tape that the semiconductor chip is positioned in the area shown by a dotted line. In this case, the semiconductor chip is adhered to TAB tape so that the pad of each electrode on the semiconductor chip is positioned close to the portion where each end of the end portion of the plurality of leads is exposed.

Thereafter, TAB tape is immersed in a nickel plating bath together with a plating electrode. The nickel plating bath is generally called a watt bath, and nickel sulfate, nickel chloride, and adhesive are used. After the TAB tape and the plating electrode are immersed in the watt bath, a predetermined direct voltage is applied between the common electrode 42 and the plating electrode in order that the common electrode 42 serves as a positive side and the plating electrode serves as a negative side, and electrolytic plating is performed for a predetermined period of time. For example, a direct voltage to be applied was set to 2 V, a current to be supplied between the positive and negative sides was set to 60 mA, and plating time was set to 10 minutes. As a result, a nickel plating layer having a thickness of 10 μm was obtained as metal plating layer 20. The metal plating layer grows from each end surface of the top end portion of the inner lead immediately after plating starts. Then, if the growth advances and the plating layer contacts the electrode pad on the semiconductor chip, the metal layer also grows in the electrode pad, and both the common electrode 42 and the plating electrode are electrically connected by the plating layer. After the end of plating, the plating layer is washed with pure water, and contaminant, which was adhered to the surface when plating, is removed. Additionally, in the surface of each lead electrode 41, which comprises the inner and outer leads, the majority of the surface other than the top end portion of the inner lead is coated with an epoxy insulating film, which is called green coat. Thereby, it is possible to form the plating layer in only the necessary portion. Due to this, plating time can be shortened.

Various modifications of the first embodiment will be explained.

The above embodiment explained that the electrode pads were arranged in line with a predetermined distance. In the modified device of FIG. 7, the electrode pads 14 are arranged on the semiconductor chip in a zig-zag manner. The same reference numerals as FIG. 4 are used in the portions corresponding to the portions of FIG. 4, and the explanation thereof is omitted.

FIG. 8 shows a modification of the device using a semiconductor which is the so-called free access pad layout system wherein the electrode pads are arranged on the entire surface of the semiconductor chip at random.

As mentioned above, the present invention can be used in any type of chip regardless of the arrangement of the electrode pads on the chip.

Next, other embodiments of the present invention will be explained.

Figure 9:
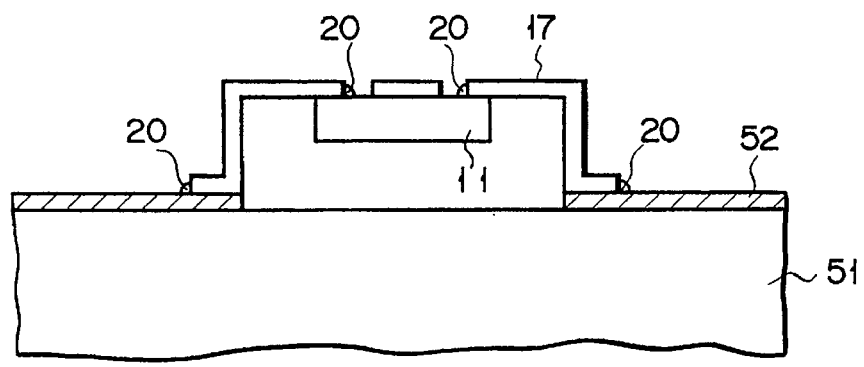
FIG. 9 is a cross sectional view showing a device of a second embodiment of the present invention.

FIG. 9 shows the structure of the semiconductor device according to a second embodiment of the present invention wherein the present invention is used in the connection between the outer leads of the lead frame and the wiring pattern on the printed circuit board. In the drawing, reference numeral 11 is a semiconductor chip, and reference numeral 17 is a TAB tape. In this embodiment, the top end portion of the inner lead of the TAB tap and electrode pad (not shown) on the semiconductor chip 11 are electrically connected by a metal plating layer 20 similar to the first embodiment. According to the second embodiment, a wiring pattern 52, which is formed on a printed circuit board 51, and the outer lead of the TAB tape are also electrically connected by the metal plating layer 20.

Figure 10:
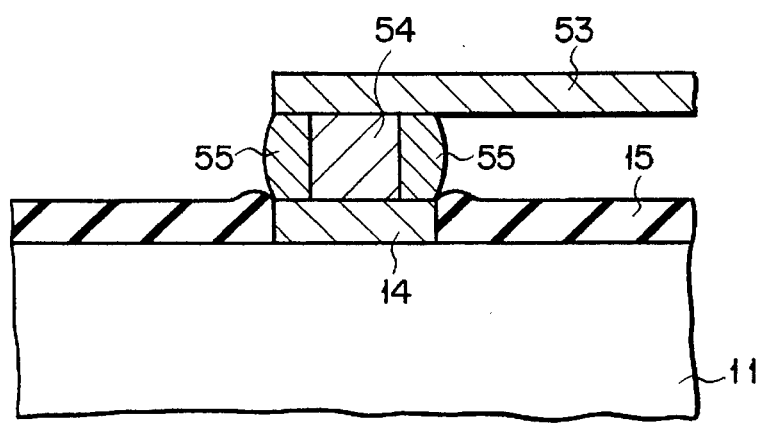
FIG. 10 is a cross sectional view showing a device of a third embodiment of the present invention.

FIG. 10 shows the structure of the semiconductor device relating to a third embodiment of the present invention wherein the present invention is used in the connection between the outer leads of the lead frame and the wiring pattern on the printed circuit board. According to the third embodiment, the lead frame is formed by punching a metal thin film, which is formed of alloy such as 4-2 alloy and copper by a press process. An inner lead 53 of the lead frame and an electrode pad 14 on a semiconductor chip are electrically connected by use of both a conductive adhesive 54 and a metal plating layer 55. In the case of the first embodiment using the TAB tape, the metal plating layer can be formed so that the semiconductor chip is adhered to the TAB tape by the adhesive in advance. In the case of using the lead frame formed by punching the metal thin film, the adhesive 54 is formed on each electrode pad 14 in advance by a screen printing method and the electrode pad 14 and the lead frame 53 are adhered by the adhesive 54. Thereafter, the plating layer 55 is formed by the same method as mentioned above, and both the electrode pad and the lead frame can be electrically connected.

As mentioned above, the present invention can be used in not only the connection between the inner lead of the lead frame and the electrode pad on the semiconductor chip but also the connection between the outer lead and the wiring pattern on the printed circuit board, and the same effect can be obtained. Moreover, the present invention can be used in the electrical connection between a liquid crystal display and TAB tape.

The present invention is not limited to the above-mentioned embodiments. It is needless to say that the present invention can be variously modified. For example, the above embodiments explained the case wherein the metal plating layer was the nickel plating layer. According to the present invention, Au plating layer and copper plating layer can be used in addition to the above case.

The above first embodiment explained the case wherein the majority of the surface other than the top end portion of the inner lead was coated with the insulating film in advance. However, in the portion other than the top end portion of the inner lead, the thickness of which the plating layer can grow on the above portion is about only 1/10 times that of the top end portion when the electrolytic plating is performed, the adherence of the insulating film can be omitted.

Moreover, the method of the above embodiment explained the case that the plating layer was formed by the electrolytic plating method. However, the plating layer can be formed by an electrolessly plating method.

Figure 11:
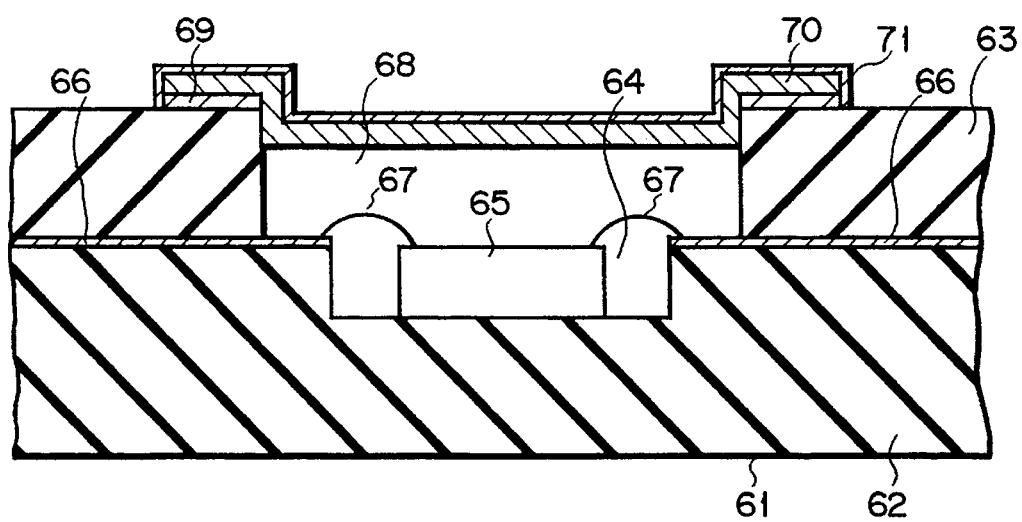
FIG. 11 is a cross sectional view showing a device of a fourth embodiment of the present invention.

FIG. 11 is a cross sectional view showing a device of a fourth embodiment of the present invention. The above embodiments explained the case in which two wirings are connected to each other by the plating metal. However, this plating metal can be used as a sealing for the semiconductor device. The device of the fourth embodiment shows that the plating layer is used as a sealing for a cap of a PGA (Pin Grid Array) type semiconductor device. In FIG. 11, a package 61 is formed by layering two ceramic plates 62 and 63. On one ceramic plate 62, a concave portion 64 is formed, and a semiconductor chip 65 is contained in the concave portion 64. Also, a plurality of wirings 66, 66 . . . are formed on the surface of one ceramic plate 62. Moreover, there are formed a plurality of pads (not shown) on the surface of the semiconductor chip 65. Then, the plurality of pads on the semiconductor chip 65 and the plurality of wirings 66, 66 . . . are connected by metal wires 67, 67 . . . , respectively.

On the other ceramic plate 63, there is formed an opening 68 having an area larger than the concave portion 64 at the position corresponding to the concave portion 64 of one ceramic plate 62. The opening 68 forms the concave portion 64 and the containing section of the semiconductor chip 65. Then, on the surface of the ceramic plate 63 around the opening 68, there is formed, for example, an Fe—Ni metal layer 69. Moreover, the opening 68 of the ceramic plate 63 is covered with a cap 70. The metal layer 69 and the cap 70 are adhered to each other by a metal plating layer 71 formed of nickel. The metal plating layer 71 is also formed between the cap 70 and the metal layer 69 and on the entire exposed surface.

As mentioned above, the metal plating layer can be used as a sealing for the cap.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a lead frame formed of a conductive material and having a plurality of leads, each of said leads having a distal end side face;
   a semiconductor chip having a plurality of electrode pads on a surface thereof; and
   a plurality of metal plating layers, each electrically connecting the distal end side face of one of the plurality of leads to one of the plurality of electrode pads, each of said metal plating layers having a substantially L-shaped cross section.

2. The semiconductor device according to claim 1, wherein the metal plating layers are nickel plating layers.

3. The semiconductor device according to claim 1, wherein the lead frame is a TAB type in which a wiring pattern is formed on an insulating film.

4. The semiconductor device according to claim 1, wherein the lead frame is a punching metal film.

5. The semiconductor device according to claim 1, wherein each of the plurality of electrode pads formed on the surface of the semiconductor chip comprises an aluminum layer, a titanium layer formed on the aluminum layer, and a layer formed on the titanium layer comprising one of a gold layer, a nickel layer, and a copper layer.

6. The semiconductor device according to claim 1, wherein the plurality of electrodes are arranged on the surface of the semiconductor chip in a zig-zag arrangement.

7. A semiconductor device comprising:
   a semiconductor chip having a plurality of electrode pads on a surface thereof;
   an insulating film;
   a plurality of wiring patterns formed on the insulating film, each of the wiring patterns having a distal end portion which is arranged close to a corresponding one of the electrode pads;
   an adhesive for adhering the wiring patterns to the semiconductor chip; and
   a plurality of metal plating layers, each electrically connecting the distal end portion of one of the plurality of wiring patterns to a corresponding one of the plurality of electrode pads.

8. The semiconductor device according to claim 7, wherein the plurality of metal plating layers are nickel plating layers.

9. The semiconductor device according to claim 7, wherein each of the plurality of electrode pads formed on the surface of the semiconductor chip comprises an aluminum layer, a titanium layer formed on the aluminum layer, and a layer formed on the titanium layer, comprising one of a gold layer, a nickel layer, and a copper layer.

10. The semiconductor device according to claim 7, wherein the plurality of electrode pads are arranged on the surface of the semiconductor chip in a zig-zag arrangement.

11. A semiconductor device comprising:
    a semiconductor chip having a plurality of electrode pads on a surface thereof;
    an insulating film;
    first wiring patterns formed on the insulating film, each of the first wiring patterns having a first distal end portion, and a second distal end portion opposing the first distal end portion, the first distal end portion of each of the first wiring patterns being arranged close to a corresponding one of the electrode pads;
    an adhesive used for connecting the wiring patterns to the semiconductor chip;
    a plurality of first metal plating layers, each of the first metal plating layers electrically connecting each of the electrode pads to the first distal end portion of the corresponding one of the first wiring patterns;
    a wiring board having a plurality of second wiring patterns on a surface thereof; and
    a plurality of second metal plating layers, each electrically connecting one of the plurality of second wiring patterns to the second distal end portion of a corresponding one of the plurality of first wiring patterns.

12. A semiconductor device comprising:
    a lead frame formed of a conductive material and having a plurality of leads;
    a semiconductor chip having a plurality of electrode pads on a surface thereof;
    a plurality of conductive adhesive members arranged in correspondence to the electrode pads and the leads, each of the members electrically connecting a corresponding one of the plurality of leads to a corresponding one of the plurality of electrode pads; and
    a plurality of metal plating layers arranged in correspondence to the conductive adhesive members, each of the metal plating layers being formed around a corresponding one of the plurality of conductive adhesive members and electrically connecting a corresponding one of the plurality of leads to a corresponding one of the plurality of electrode pads.

13. A semiconductor device comprising:
    a lead frame formed of a conductive material and having a plurality of leads, each of the leads having a distal end side face;
    a semiconductor chip having a plurality of electrode pads on a surface thereof; and
    a plurality of metal plating layers, each electrically connecting the distal end side face of one of the plurality of leads to one of the plurality of electrode pads, each of the plurality of metal plating layers having a substantially L-shaped cross section.

14. The semiconductor device according to claim 13, wherein the metal plating layers are nickel plating layers.

15. The semiconductor device according to claim 13, wherein the lead frame is a TAB type in which a wiring pattern is formed on an insulating film.

16. The semiconductor device according to claim 13, wherein the lead frame is a punching metal film.

17. The semiconductor device according to claim 13, wherein each of the plurality of electrode pads formed on the surface of the semiconductor chip comprises an aluminum layer, a titanium layer formed on the aluminum layer, and a layer formed on the titanium layer comprising one of a gold layer, a nickel layer and a copper layer.

18. The semiconductor device according to claim 13, wherein the plurality of electrode pads are arranged on the surface of the semiconductor chip in a zig-zag arrangement.

19. A semiconductor device comprising:
    a semiconductor chip having a plurality of electrode pads on a surface thereof;
    an insulating film;
    a plurality of wiring patterns formed on the insulating film, each of the wiring patterns having a distal end portion arranged close to a corresponding one of the electrode pads;

an adhesive for connecting the wiring patterns to the semiconductor chip;

a plurality of metal plating layers, each electrically connecting the distal end portion of one of the plurality of wiring patterns to a corresponding one of the plurality of electrode pads.

20. The semiconductor device according to claim 19, wherein the plurality of metal plating layers are nickel plating layers.

21. The semiconductor device according to claim 19, wherein each of the plurality of electrode pads formed on the surface of the semiconductor chip comprises an aluminum layer, a titanium layer formed on the aluminum layer, and a layer formed on the titanium layer, comprising one of a gold layer, a nickel layer, and a copper layer.

22. The semiconductor device according to claim 19, wherein the plurality of electrode pads are arranged on the surface of the semiconductor chip in a zig-zag arrangement.

23. A semiconductor device comprising:

a semiconductor chip having a plurality of electrode pads on a surface thereof;

an insulating film:

first wiring patterns formed on the insulating film, each of the first wiring patterns having a first distal end portion and a second distal end portion opposing the first distal end portion, the first distal end of each of the first wiring patterns being arranged close to a corresponding one of the electrode pads;

an adhesive for connecting the first wiring patterns to the semiconductor chip;

a plurality of first metal plating layers, each of the first metal plating layers electrically connecting each of the electrode pads to the first distal end of a corresponding one of the first wiring patterns;

a wiring board having a plurality of second wiring patterns on a surface thereof; and a plurality of second metal plating layers, each of the second metal plating layers electrically connecting each of the second wiring patterns to the second distal end portion of a corresponding one of the plurality of first wiring patterns.

24. A semiconductor device comprising:

a lead frame formed of a conductive material and having a plurality of leads;

a semiconductor chip having a plurality of electrode pads on a surface thereof;

a plurality of conductive adhesive members arranged in correspondence to the electrode pads and the leads, each of the members electrically connecting a corresponding one of the plurality of leads to a corresponding one of the plurality of electrode pads; and a plurality of metal plating layers arranged in correspondence to the conductive adhesive members, each of the metal plating layers being formed to surround a corresponding one of the plurality of conductive adhesive members and to electrically connect a corresponding one of the plurality of leads to a corresponding one of the plurality of electrode pads.

25. A semiconductor device according to claim 7, wherein said adhesive connects the wiring patterns to a peripheral portion of the semiconductor chip.

26. A semiconductor device according to claim 7, wherein said adhesive connects the wiring patterns to a central portion of the semiconductor chip.

27. A semiconductor device according to claim 19, she said adhesive connects the wiring patterns to a peripheral portion of the semiconductor chip.

28. A semiconductor device according to claim 19, wherein said adhesive connects the wiring patterns to a central portion of the semiconductor chip.

29. A semiconductor device comprising:

a semiconductor chip having four sides, a plurality of electrode pads being arranged on each of the four sides;

an insulating film;

a plurality of wiring pattern groups formed on the insulating film such that a plurality of wiring patterns are provided for each of the four sides of the semiconductor chip, each of the wiring patterns of each wiring pattern group having a distal end located close to a corresponding one of the electrode pads;

an adhesive member for coupling the wiring pattern groups to the semiconductor chip; and a plurality of metal plating layers, each of the metal plating layers electrically connecting the distal end of a corresponding one of the plurality of wiring patterns to a corresponding one of the plurality of electrode pads.

30. A semiconductor device comprising:

a semiconductor chip having four sides, a plurality of electrode pads being arranged on each of the four sides;

an insulating film;

a plurality of wiring pattern groups formed on the insulating film such that a plurality of wiring patterns are provided for each of the four sides of the semiconductor chip, each of the wiring patterns of each wiring pattern group having a distal end located close to a corresponding one of the electrode pads;

an adhesive member for coupling the wiring pattern groups to the semiconductor chip; and a plurality of metal plating layers connecting the distal end of a corresponding one of the plurality of wiring patterns to a corresponding one of the plurality of electrode pads.

31. The semiconductor device of claim 7, wherein each of the metal plating layers has a substantially L-shaped cross section.

32. The semiconductor device of claim 11, wherein each of the first and second metal plating layers has a substantially L-shaped cross section.

33. The semiconductor device of claim 19, wherein each of the metal plating layers has a substantially L-shaped cross section.

34. The semiconductor device of claim 23, wherein each of the first and second metal plating layers has a substantially L-shaped cross section.

35. The semiconductor device of claim 29, wherein each of the metal plating layers has a substantially L-shaped cross section.

36. The semiconductor device of claim 30, wherein each of the metal plating layers has a substantially L-shaped cross section.

* * * * *

UNITED STATES PATENT AND TRADEMARK OFFICE
CERTIFICATE OF CORRECTION

PATENT NO.   :   5,654,584
DATED        :   August 05, 1997
INVENTOR(S)  :   Takao FUJITSU It is certified that error appears in the above-indentified patent and that said Letters Patent is hereby corrected as shown below:

Claim 27, column 10, line 4, "she" should read --wherein--.

Signed and Sealed this

Twelfth Day of May, 1998

Attest:

Attesting Officer

BRUCE LEHMAN

Commissioner of Patents and Trademarks